(12) United States Patent
McCall et al.

(10) Patent No.: US 10,025,685 B2
(45) Date of Patent: Jul. 17, 2018

(54) IMPEDANCE COMPENSATION BASED ON DETECTING SENSOR DATA

(71) Applicant: Intel Corporation, Santa Clara, CA (US)

(72) Inventors: James A McCall, Portland, OH (US); Kuljit S Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 65 days.

(21) Appl. No.: 14/670,411

(22) Filed: Mar. 27, 2015

(65) Prior Publication Data

US 2016/0284386 A1 Sep. 29, 2016

(51) Int. Cl.
*G06F 12/00* (2006.01)
*G06F 3/06* (2006.01)
*G06F 11/30* (2006.01)
*G06F 13/42* (2006.01)
*G11C 7/10* (2006.01)
*G11C 29/02* (2006.01)
*G11C 29/50* (2006.01)

(52) U.S. Cl.
CPC ...... *G06F 11/3089* (2013.01); *G06F 11/3037* (2013.01); *G06F 11/3058* (2013.01); *G06F 13/4243* (2013.01); *G11C 7/1057* (2013.01); *G11C 7/1084* (2013.01); *G11C 29/021* (2013.01); *G11C 29/028* (2013.01); *G11C 29/50008* (2013.01)

(58) Field of Classification Search
CPC ............. G06F 12/00; G06F 13/00; G06F 3/06
USPC .......... 711/100, 105–106, 154, 200
See application file for complete search history.

(56) References Cited

U.S. PATENT DOCUMENTS

| | | | | |
|---|---|---|---|---|
| 6,292,059 B1* | 9/2001 | Ao | ......... | H03F 3/087 330/284 |
| 6,476,392 B1* | 11/2002 | Kaufman | ......... | G01J 5/522 250/252.1 |
| 6,668,162 B1* | 12/2003 | Murtojarvi | ......... | H03F 1/303 330/278 |
| 7,114,087 B2* | 9/2006 | Watnik | ......... | G06F 1/206 713/320 |
| 7,683,712 B2* | 3/2010 | Suzaki | ......... | H03F 1/30 330/129 |
| 7,859,296 B2 | 12/2010 | Kim et al. | | |

(Continued)

OTHER PUBLICATIONS

International Search Report and Written Opinion for PCT Patent Application No. PCT/US2016/021153, dated Jun. 29, 2016, 10 pages.

(Continued)

*Primary Examiner* — Tuan Thai
(74) *Attorney, Agent, or Firm* — Compass IP Law PC (57) ABSTRACT

A memory subsystem manages memory I/O impedance compensation by the memory device monitoring a need for impedance compensation. Instead of a memory controller regularly sending a signal to have the memory device update the impedance compensation when a change is not needed, the memory device can indicate when it is ready to perform an impedance compensation change. The memory controller can send an impedance compensation signal to the memory device in response to a compensation flag set by the memory or in response to determining that a sensor value has changed in excess of a threshold.

22 Claims, 6 Drawing Sheets

(56) References Cited

U.S. PATENT DOCUMENTS

| | | | |
|---|---|---|---|
| 8,111,085 B2 | 2/2012 | Ibaraki et al. | |
| 8,482,339 B1 * | 7/2013 | Giuroiu .................. | H03H 11/54 327/513 |
| 2004/0260713 A1 | 12/2004 | Shimamura et al. | |
| 2005/0242833 A1 | 11/2005 | Park et al. | |
| 2006/0097749 A1 | 5/2006 | Ahmad et al. | |
| 2008/0198666 A1 | 8/2008 | Nygren | |
| 2012/0150481 A1 | 6/2012 | Cox | |
| 2012/0206165 A1 | 8/2012 | Ferolito et al. | |
| 2013/0132779 A1 | 5/2013 | Smith et al. | |
| 2014/0016404 A1 | 1/2014 | Kim et al. | |
| 2015/0067292 A1 | 3/2015 | Grunzke | |
| 2016/0042769 A1 | 2/2016 | Moran | |
| 2016/0182044 A1 | 6/2016 | Addepalli et al. | |
| 2016/0259385 A1 | 9/2016 | Tang | |

OTHER PUBLICATIONS

Nanya Technology Corp, Commercial and Industrial DDR4 4Gb SDRAM, ZQ Calibration Commands, Version 11, Mar. 2016, pp. 192-193.
Sk hynix, Computing DDR4 Device Operation, pp. 54-55.
English Translation of Search Report of R.O.C. Patent Application No. 105103783 1 page.
English Translation of Search Report of R.O.C. Patent Application No. 105103783, 2 pages.
International Preliminary Report on Patentability, PCT/US2016/021153, dated Oct. 12, 2017, 7 pages.

* cited by examiner

IMPEDANCE COMPENSATION BASED ON DETECTING SENSOR DATA

FIELD

Embodiments of the invention are generally related to inter-device I/O impedance compensation, and more particularly to managing impedance compensation based on detecting sensor data.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2015, Intel Corporation, All Rights Reserved.

BACKGROUND

Memory devices continue to scale to higher densities as the systems that use the memory increase in storage demands. Even as the amount of memory increases, there is an expectation that computing platforms such as servers, desktop or laptop computers, mobile devices, as well as consumer and business electronics will increase in performance. Increasing performance while also increasing memory size has resulted in increasing bandwidth scaling. The increased memory bandwidth scaling has required I/O (input/output) impedance compensation (ZQ comp) to be able to maintain adequate signal integrity. In previous generations of memory, different forms of resistance compensation or ZQ comp are primarily managed by the memory controller using modes in the memory devices (e.g., DRAM (dynamic random access memory)) to maintain a required tolerance. The modes refer to operating under different configuration settings.

As frequencies increase, the tolerance margins continue to increase in precision, and the overhead required of the memory controller in terms of its I/O interface idle period also continues to increase. The greater the overhead required of the memory controller, the more bandwidth is dedicated to managing the I/O tolerances, which can negatively impact performance. Traditional approaches to impedance compensation require the memory controller to periodically manage the I/O termination based on worst case system assumptions. In many cases it may not be required to perform an impedance compensation operation if the voltage and temperature of the memory devices are stable. More specifically, during an active period the operating conditions of temperature and voltage of the memory device could be reasonably stable and not require an impedance compensation adjustment. Thus, the memory controller would unnecessarily issue a ZQ comp signal to the memory devices. The unnecessary issuance of ZQ comp signals results in lower performance and increased complexity for the memory controller to manage multiple DRAM loads according to worst case where the DRAMs could operate with longer periods between adjustments.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem utilizes sensor data from the memory device to manage memory I/O (input/output) impedance compensation. Thus, the memory controller and the memory device can monitor a need for impedance compensation instead of managing impedance compensation according to worst case scenarios. Thus, the memory controller can send a ZQ comp (impedance compensation) signal when the memory device is ready for an update instead of having the memory controller regularly send ZQ comp signals when changes are not needed. The ZQ comp signal can refer to all signals issued by the memory controller to cause an update to the impedance compensation by the memory device. In one embodiment, the ZQ comp signal can include a ZQCal start signal (e.g., a signal to initiate impedance calibration) and/or a ZQCal latch signal (e.g., a signal to set the configuration for the impedance compensation). In one embodiment, the memory device indicates when it is ready to perform an impedance compensation change. In one embodiment, the memory controller can send a ZQ comp signal to the memory device in response to a compensation flag or other indication set by the memory device. In one embodiment, the memory controller can send a ZQ comp signal in response to a determination that a sensor value recorded by the memory device has changed in excess of a threshold.

The application of sensor data to the impedance compensation allows for adaptive impedance compensation management. For example, the memory device can record sensor data that indicates when a change greater than a threshold has occurred in an operating condition. A flag indicating the change can trigger the memory controller to selectively send a ZQ comp signal in response to the flag. The memory controller can selectively issue ZQ comp signals to multiple memory devices to manage down time on the command/address (C/A) bus, and thus improve bandwidth utilization of the C/A bus. In one embodiment, the memory controller issues only a ZQCal latch command in response to sensor data. In one embodiment, the memory controller issues both a ZQCal start command and a ZQCal latch command in response to sensor data.

In one embodiment, the memory device generates a flag in response to detecting a change in temperature or thermal performance condition or operating condition, such as with a temperature sensor. In one embodiment, the memory device generates a flag in response to detecting a change in an operating voltage, such as with a voltage sensor. It will be understood that modern memory devices include multiple on-die sensors to detect changes in performance conditions. Traditionally such information is used to adjust operation of self-refresh or other operations. Thus, the memory device can monitor conditions that affect I/O impedance with sensors that are already present but traditionally used for other purposes.

In one embodiment, the memory device records sensor data in a Mode Register or other register on the memory device. In one embodiment, a controller on the memory device itself determines when the sensor data has changed more than a threshold, and sets a flag in a Mode Register. In one embodiment, the memory device provides the sensor data periodically to the memory controller, which can then determine whether a change exceeds a threshold, and indicates a need to perform impedance compensation. In one embodiment, the memory controller periodically monitors or checks the Mode Register to determine if a flag has been set indicating the need for impedance compensation adjustment. In one embodiment, a connector between the memory controller and memory device can be used as a flag for impedance compensation. The connector could be used for multiple condition flags, and determine what the flag indicates if set, by reading a register.

In one embodiment, the memory controller issues an impedance compensation signal to trigger a change in the memory device I/O settings. For example, the impedance compensation signal can trigger the memory device to make an adjustment to driver impedance. In another example, the impedance compensation signal can trigger the memory device to make an adjustment to on-die termination settings.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-M RAM, or a combination of any of the above, or other memory.

Figure 1:
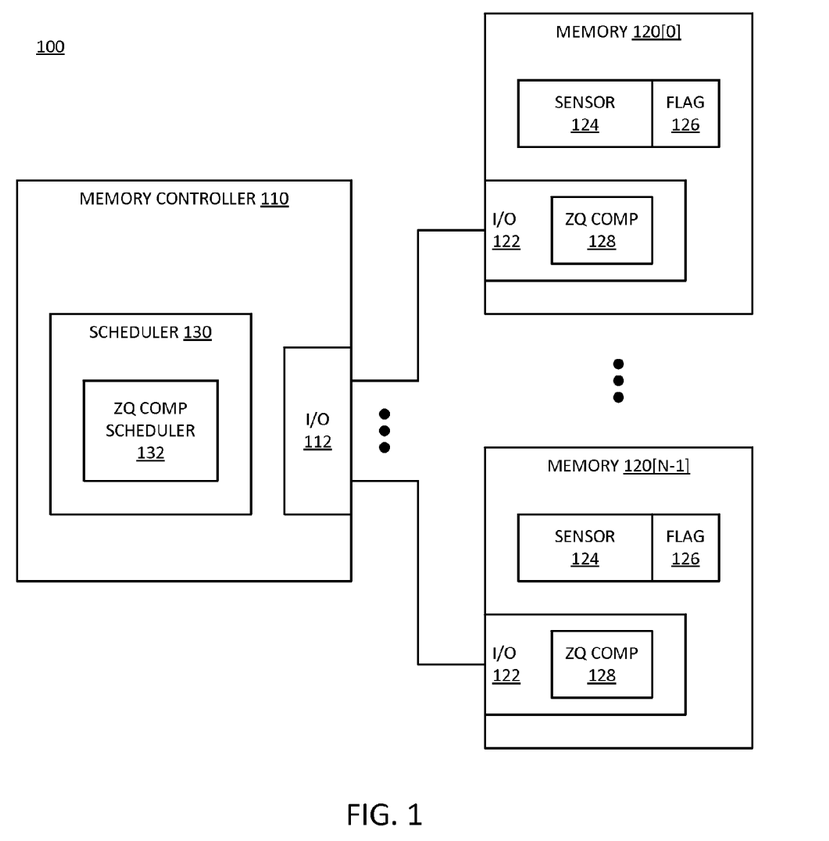
FIG. 1 is a block diagram of an embodiment of a system in which impedance compensation is based on memory device sensor data.

FIG. 1 is a block diagram of an embodiment of a system in which impedance compensation is based on memory device sensor data. System 100 represents components of a memory subsystem having a memory controller 110 that manages impedance compensation of memory devices 120 in accordance with any embodiment described herein. System 100 can be included in any type of computing device or electronic circuit that performs I/O impedance compensation, and is not necessarily limited to memory subsystems, although the memory subsystem is the example used throughout. System 100 receives memory access requests from a host or a processor, which is processing logic that executes operations based on data stored in memory 120 or generates data to store in memory 120. Such a processor can be or include host processor, central processing unit (CPU), microcontroller or microprocessor, graphics processor, peripheral processor, application specific processor, or other processor, whether single core or multicore processor.

Memory controller 110 represents logic to interface with memory 120 and manage access to data stored in the memory. In one embodiment, memory controller 110 is integrated into the hardware of the host processor. In one embodiment, memory controller 110 is standalone hardware, separate from the host processor. Memory controller 110 can be a separate circuit on a substrate that includes the processor. Memory controller 110 can be a separate die or chip integrated on a common substrate with a processor die (e.g., as a system on a chip (SoC)). In one embodiment, at least some of memory 120 can be included on a SoC with memory controller 110 and/or a host processor.

In one embodiment, memory 120 includes volatile memory resources. In one embodiment, memory 120 includes DRAMs. The memory resources of memory 120 can be managed, for example, as different levels of memory with separate channels, DIMMs (dual inline memory modules), ranks, DRAMs, banks, pages, rows, cachelines, and/or other architecture. Each separate memory level and resource can be individually addressable. In one embodiment, system 100 includes multiple memory 120[0] . . . 120 [N−1], where N is an integer (typically a binary integer, or in groups of $2^N+1$).

Memory 120 includes I/O 122, which includes hardware resources to interconnect with corresponding I/O 112 of memory controller 110. I/O 112, 122 can include drivers, ODT (on die termination), pins, connectors, traces, pads, wires, and/or other hardware. I/O 122 and 112 are typically organized in one or more buses of signal lines, such as a command/address (C/A) bus for memory controller 110 to send access commands and address information, and a data bus to allow memory controller 110 and memory 120 to exchange data. The data is read from the different memory resources with a Read command or written to the memory resources with a Write command. I/O 112 and I/O 122 can include data interfaces of different sizes, such as x4, x8, or x16 interfaces, where the 'x' represents the interface and the numeral after the 'x' represents the data bit width of the interface (e.g., x4 has a 4-bit wide interface, and so forth).

In one embodiment, each memory 120 includes at least one sensor 124. Sensor 124 can include a thermal sensor, a current sensor, a voltage sensor, or other device to monitor an operating condition of the memory. It will be understood that different I/O impedance is useful for different operating conditions. Thus, in one embodiment, memory 120 reports a change in an operating condition detected by sensor 124 to memory controller 110. In response to the change in operating condition, memory controller 110 can adjust one or more settings related to ZQ comp 128, which represents hardware mechanisms that configure the I/O impedance (whether input or output) of memory 120. In one embodiment, if memory 120 determines from a reading of sensor 124 that an operating condition has changed by more than a threshold, memory 120 can set flag 126.

It will be understood that common component numbering is shown for each of memory 120[N−1:0], but each component operates independently within each memory device. Thus, sensor 124 of memory 120[0] may trigger flag 126 indicating a change in operating condition while the same operating condition has not yet triggered within memory 120[N−1]. As such, each memory 120 can separately indicate its operating condition to memory controller 110. In one embodiment, memory controller 110 separately manages the ZQ comp 128 of each individual memory 120. In one embodiment, such as in an LPDDR4 implementation, each memory 120 may include two separate channels on the same memory die. In such an implementation, ZQ comp 128 can be applied to both channels of a single die, assuming that the proximity of each channel on the same die would experience the same operating conditions.

Memory controller 110 includes scheduler 130, which represents logic within memory controller 110 to manage the timing of access operations and commands with respect to memory 120. Scheduler 130 can generate and determine how to order commands to service requests for data generated by a host processor. In one embodiment, scheduler 130 includes impedance compensation scheduler 132. In one embodiment, scheduler 132 is part of the logic of scheduler 130. Scheduler 132 is illustrated specifically with reference to the ability of memory controller 110 to manage operations related to adjusting settings of ZQ comp 128 in the various memories 120.

Consider an example where each memory 120 is a DRAM having sensor 124 which includes a thermal sensor, and flag 126 is a bit in a Mode Register of the DRAM. In one embodiment, the DRAM utilizes its existing on-die thermal sensor to notify memory controller 110 when an adjustment to a ZQ comp setting is required. In one embodiment, memory controller 110 monitors the Mode Register bit represented by 126 (e.g., reading the bit periodically to determine its state). Each DRAM 120 can set flag 126 based on a difference in the temperature from the last notification. Thus, once the DRAM sets flag 126, it can store the value as a baseline for a subsequent flag to indicate a need to adjust ZQ comp 128. It will be understood that a change in the sensor reading can be either a positive or a negative change. In one embodiment, sensor 124 internally controls the comparison, and sets flag 126 to trigger memory controller 110 to issue a ZQ calibration latch command (e.g., ZQCal latch).

In one embodiment, rather than performing the comparison itself, memory 120 can store the previous and current readings (values) of sensor 124 and trigger memory controller 110 to read and compare the values. With flag 126 or other indication from memory 120, the host or memory controller 110 would not need to manage timing associated with periodically issuing a ZQCal latch command. Thus, memory 120 can trigger memory controller 110 to issue the command when it needs the command issued, and memory controller 110 would not need to manage the timing or use up C/A bus bandwidth sending commands that will be ignored by memory 120 (ignored because no ZQ comp change or update is necessary).

In addition to the benefits with respect to a single memory device 120, it will be understood that many applications of system 100 in a computing device will include multiple memory devices 120. With multiple memory devices 120, memory controller 110 is traditionally required to manage the timing of issuing a ZQ comp signal to all memories 120. Such a process traditionally takes time over a millisecond (ms) or more, even though the timing for each individual device is traditionally on the order of 1 microsecond (us). By allowing memory controller 110 to issue ZQ comp signals in response to sensor data on each memory device, memory controller 110 can save considerable bandwidth.

Additionally, in one embodiment, ZQ comp scheduler 132 can include logic to determine preferred timing to issue ZQ comp signals. For example, in one embodiment, scheduler 132 waits until a threshold number of memories 120 (e.g., some number more than one) have set flag 126 prior to generating any ZQ comp signals. Thus, when scheduler 132 disables access traffic commands on the C/A bus to schedule ZQ comp signal(s), it can issue signals for multiple devices and spread the overhead over multiple devices. In one embodiment, scheduler 132 includes logic to wait until a threshold number of memories 120 trigger flag 126, unless a threshold period of time has passed since the first flag was detected, and then issue the ZQ comp signals anyway. In one embodiment, memory controller sends a sequence of ZQ comp signals to multiple parallel memories 120 in response to one or more flags 126 being set. In one embodiment, memory controller 110 sends a series of commands for impedance compensation to a subset or all memories 120 in response detecting a first flag 126 by one of the memories.

By separately monitoring flags 126 from each different memory 120, memory controller 110 can avoid sending ZQ comp signals that are not needed. Instead of having memory controller 110 incur overhead in preemptively having both memory controller 110 and memories 120 performing ZQ comp operations when not required, system 100 can respond to the need for such operations. Such operation can provide multiple paths to improve system performance by allowing adjustments on how the impedance compensation can be managed. For example, in one embodiment, each memory 120 can know (e.g., be configured with values to indicate) when the thresholds can be set to optimize for them to meet a tolerance improving the speed of the system. Such configuration can result in better tolerances for I/O due to each memory vendor controlling the timing of impedance compensation to their specific process and/or memory implementation, rather than relying on generic system-wide worst case tolerances being used.

In one embodiment, memory controller 110 reads sensor data from each memory 120. In one embodiment, reading the sensor data can be understood as reading flag 126 and/or reading the values of sensor 124. Scheduler 132 can determine that a performance condition has changed in excess of a threshold by either reading flag 126 or by reading the sensor data and comparing it against a previously stored reading. Memory controller 110 can store the previous reading and/or memory 120 can store the previous reading. Memory controller 110 generates an impedance compensation signal to trigger memory 120 to adjust at least one setting related to ZQ comp 128.

Figure 2:
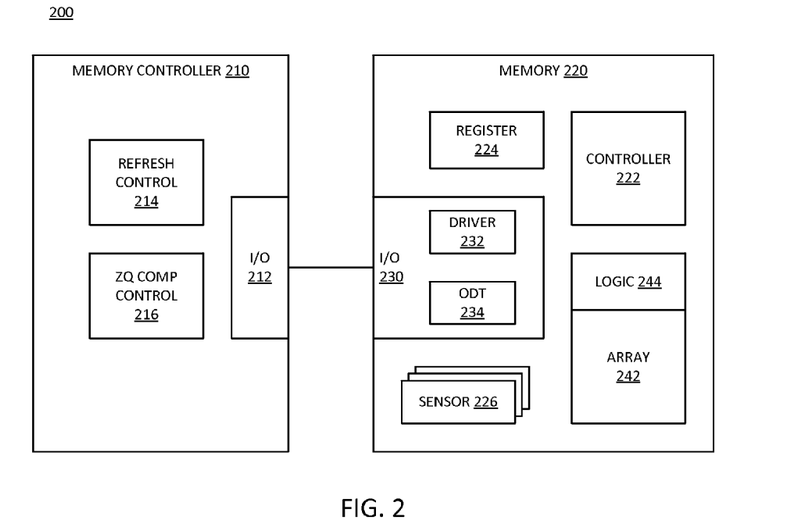
FIG. 2 is a block diagram of an embodiment of a memory subsystem in which memory device sensor data can be used for impedance compensation in addition to refresh control settings.

FIG. 2 is a block diagram of an embodiment of a memory subsystem in which memory device sensor data can be used for impedance compensation in addition to refresh control settings. System 200 can be one example of a memory subsystem in accordance with system 100 of FIG. 1. System 200 more specifically illustrates certain features that can be implemented by one embodiment of system 100. Memory controller 210 manages access to memory 220. Memory 220 can be one of multiple memory devices in system 200. Memory controller 210 includes I/O 212 to interface with memory 220 via I/O 230 of memory 220.

In one embodiment, memory controller 210 includes refresh control 214. Refresh control 214 represents logic within memory controller 210 to manage the refresh of volatile memory 220. Refresh control 214 can include logic for managing self-refresh settings for memory 220 and/or for normal refresh where memory controller issues the refresh commands. In one embodiment, refresh control 214 adjusts its operation based on information from sensors in memory 220.

In one embodiment, memory controller 210 includes ZQ compensation control 216. ZQ comp control 216 represents logic to manage impedance compensation for the I/O interface of memory 220 (I/O 230). ZQ comp control 216 can perform compensation control in accordance with any embodiment described herein. ZQ comp control 216 can be or include a scheduler to manage the timing of compensation control in system 200. ZQ comp control 216 determines when to send an impedance compensation signal to memory 220 and other memory devices based on sensor data indicating that the sensor has detected a change in an operating condition. In one embodiment, memory 220 will flag the change, but memory controller 210 will still determine when to issue a signal to trigger the memory device to adjust its I/O compensation. It will be understood that even though memory controller 210 makes a determination of when to send a compensation signal, the memory controller generates the signal in response to detecting or determining the flag or indication by the memory.

Memory 220 includes array 242, which represents the memory resources of memory 220. The memory resources can include multiple rows of data, addressable by row and column. Logic 244 represents decode logic within memory 220 to address a location within array 242 identified by a memory access command, such as a read or write. Controller 222 represents a controller of memory 220. It will be understood that memory controller 210 is a controller for system 200 and controls access to memory 220 for the host. Controller 222 represents processing resources within memory 220 to enable the memory to manage and schedule its own operations to service the memory access commands received from memory controller 210.

In one embodiment, memory 220 includes one or more sensors 226. Sensor 226 can include a voltage sensor, temperature sensor, current sensor, or other sensor that can detect a change in a performance condition that affects the impedance of I/O 230. It will be understood that many modern memories include sensors on-die. The sensors have traditionally been used to detect conditions related to overage conditions. Certain changes in the conditions detected by sensor 226 can also indicate a condition that affects the input and output impedance of I/O 230. In one embodiment, controller 222 determines based on readings from sensor 226 that a condition has changed in excess of a threshold. It will be understood that the threshold will be set based on system architecture, memory type, I/O type, memory size, and other factors. The threshold determines when a performance condition changes sufficiently to have an undesired impact on the I/O impedance of I/O 230. A change in I/O impedance an affect margining and/or timing of transmit and receive.

I/O 230 includes driver 232 to drive the I/O signal lines for memory 220 to send data to memory controller 210. In one embodiment, I/O 230 includes ODT (on-die termination) 234 to control the input impedance for memory 220 to receive data from memory controller 210. Driver 232 and ODT 234 are configurable by settings with memory 220, and can collective be referred to as I/O settings. The settings of driver 232 and ODT 234 can affect timing, reflections, and other aspects of signal integrity on exchanges (either transmit or receive) between memory controller 210 and memory 220. In one embodiment, register 224 represents a register that includes I/O settings for I/O 230. Changes in certain performance conditions, such as operating voltage and operating temperature can cause the impedance to drift, even without changing the I/O settings. Adjustments to the I/O settings (ZQ comp) can compensate for the changing conditions. In one embodiment, memory 220 includes two channels on a single memory die, and the I/O settings are shared across channels.

In one embodiment, the I/O settings apply to different I/O for memory 220. For example, driver 232 can apply to bidirectional signal lines (such as a data bus), but will not apply to a unidirectional bus (such as a command/address bus). ODT 234 can apply to both unidirectional and bidirectional signal lines. In one embodiment, ODT includes both pull up and pull down legs, and combinations of pull up and pull down can be configured, as is understood in the art. The I/O settings can determine how hard (e.g., how much current to use) driver 232 is to drive the signal lines, and how ODT is to be configured to terminate the signal lines. A ZQCal signal or other compensation signal from memory controller 210 can initiate the adjustment to I/O settings within memory 220.

In one embodiment, register 224 represents or includes a Mode Register for memory 220. A Mode Register is a register within memory 220 that controls various operating settings for memory 220. The different settings can correspond with different modes of operation. In one embodiment, memory controller 210 simply sets a specific bit pattern to register elements of the Mode Register to place memory 220 in a specific mode. Depending on what mode memory 220 is in, controller 222 can apply certain settings to I/O 230 and/or other components of memory 220 and/or apply specific timing parameters to its operations.

In one embodiment, memory 220 sets a flag in register 224 (which can be a Mode Register or other register accessible by memory controller 210) in response to detecting a change in sensor 226. For example, controller 222 can store (in a register or memory location used by controller 222 for its operation) one or more values of readings from sensor 226. Memory 220 can detect a change in a new sensor reading as compared to a previous or stored reading. In one embodiment, register 224 represents storage where one or more sensor values can be stored. In one embodiment, memory controller 210 periodically reads the value or flag set by memory 220 in register 224 to determine whether the memory is ready for an adjustment to its I/O impedance settings. System 200 could alternatively be configured with an interrupt-based mechanism. However, an interrupt mechanism may require a dedicated signal line or multiplexed/repurposed signal line to convey the interrupt from memory 220 to memory controller 210.

Figure 3:
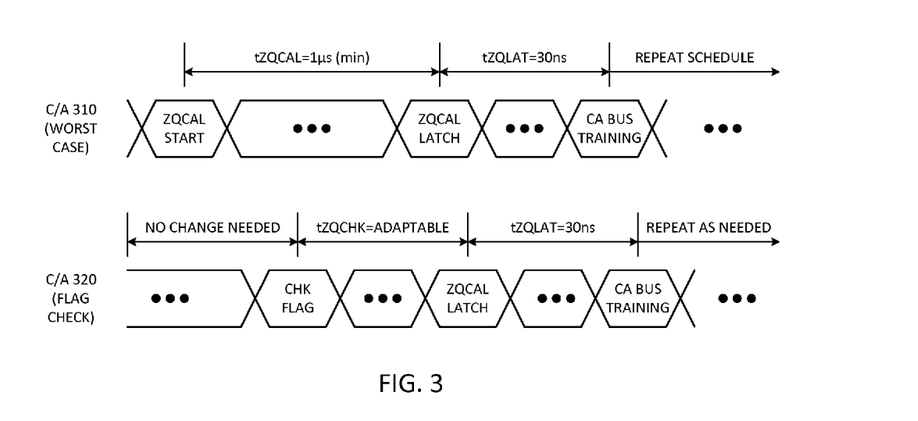
FIG. 3 is an embodiment of a timing diagram of a command/address timing for adaptable impedance compensation.

FIG. 3 is an embodiment of a timing diagram of a command/address timing for adaptable impedance compensation. C/A signal 310 represents a traditional approach to impedance compensation, which is based on worst case system conditions. With a worst case approach, C/A 310 illustrates a repeated schedule wherein the memory controller initiates impedance compensation (referred to as ZQ comp for purposes of FIG. 3) with a ZQCal start signal. The timing between initiating the ZQCal and issuing a ZQ comp latch signal (ZQCal latch) is tZQCal, which is scheduled to be 1 microsecond (us) minimum. Thus, the memory controller traditionally must initiate a ZQ calibration to trigger the memory to prepare for the ZQ comp, and then issue a latch signal to cause the memory to latch the ZQ comp. The time for the memory device to latch the ZQ comp is tZQLat, which is approximately 30 nanoseconds (ns).

In some cases the memory controller will hold the C/A bus idle (stop the bus) during the adjustment, and thus, C/A 310 will experience the overhead of tZQCal+tZQLat for each calibration performed, for every memory device. The memory controller must traditionally repeat the schedule on C/A 310 for each memory device, regardless of whether the memory needs to adjust its ZQ comp settings. Depending on the system configuration, the idle time of the C/A bus, and consequently the loss in active bandwidth, could extend into milliseconds of idle time per second. In other cases, the memory controller can hide the tZQCal latency in the background by continuing to issue other commands. However, the timing must still be monitored and scheduled for each device over a regular schedule regardless of whether the memory device needs to be updated or not, which can unnecessarily tie up memory controller resources.

C/A 320 illustrates a flag check mechanism to issuing ZQ comp in accordance with any embodiment described herein. The issuing of ZQ comp in accordance with C/A 320 can significantly reduce the overhead associated with ZQ comp. Instead of needing to periodically issue the ZQ comp commands and schedule ZQCal latch after the 1 us period, the memory controller only issues ZQ comp commands as needed. C/A 320 starts off illustrating a period of time where no change to the impedance settings are needed because there is no detected change to performance conditions, or because the changes to performance conditions do not exceed a threshold that indicates the need to adjust compensation. Assuming some period of time after a change is not needed, in one embodiment the memory controller checks a flag that the memory will set if the sensors indicate a change in a performance condition in excess of a threshold. Such a determination can be made in accordance with any embodiment described herein.

Assuming that the flag check in C/A 320 does not indicate a need to perform ZQ comp, the memory controller will continue operation without issuing a ZQ comp command. Assuming that the flag check in C/A 320 does indicate a need to perform ZQ comp (the condition shown in FIG. 3), the memory controller issues a ZQCal latch signal. It will be understood that the time tZQChk (time between checking the flag and issuing a latch signal) is adaptable in at least two ways. tZQChk is adaptable because it is expected that the memory controller will not always issue a ZQCal latch signal directly after performing a check, because at least some of the time the flag will not be set. tZQChk is also adaptable in that, in one embodiment, even when the flag is set, the memory controller can control when to issue the ZQCal latch signal for at least a period of time. For example, the memory controller can wait until a certain number of memory devices set a flag before issuing ZQCal latch. It will be understood that after issuing ZQCal latch on C/A 320, the same period of time, tZQLat of approximately 30 ns occurs. The memory controller will repeat the checking and issuing of ZQCal latch only as needed in C/A 320.

In one embodiment, the time to check the flag and determine to issue ZQCal latch is comparable to the time tZQLat. Thus, the timing from the flag check to ZQCal latch can be on the order of tens of nanoseconds, which is significantly lower than the 1 us that the memory controller must traditionally manage. Also, in an embodiment where multiple latches are detected from multiple different memory devices, multiple devices can be ready for a ZQ comp adjustment, and can all be latched in sequence, which reduces significant overhead from not needing to initiate ZQ comp in multiple memory devices that do not need to update their impedance compensation. Such an approach can maximize the scheduling of ZQ comp signals on C/A 320.

In one embodiment, a memory device includes sensors that it monitors for purposes of setting the timing configuration of refresh state (e.g., timing of scheduling by the memory device itself for self-refresh and/or the timing of scheduling by the memory controller for auto refresh). In one embodiment, the memory controller periodically checks the sensor data for purposes of configuring refresh timing. Thus, in one embodiment, the memory controller can additionally perform impedance compensation checking based on the same sensor data checked for refresh. In such an implementation, a readout or checking of a ZQ comp flag can occur during a refresh readout or refresh monitoring operation. Therefore, checking the ZQ comp flag can be implemented with very minimal overhead.

Figure 4:
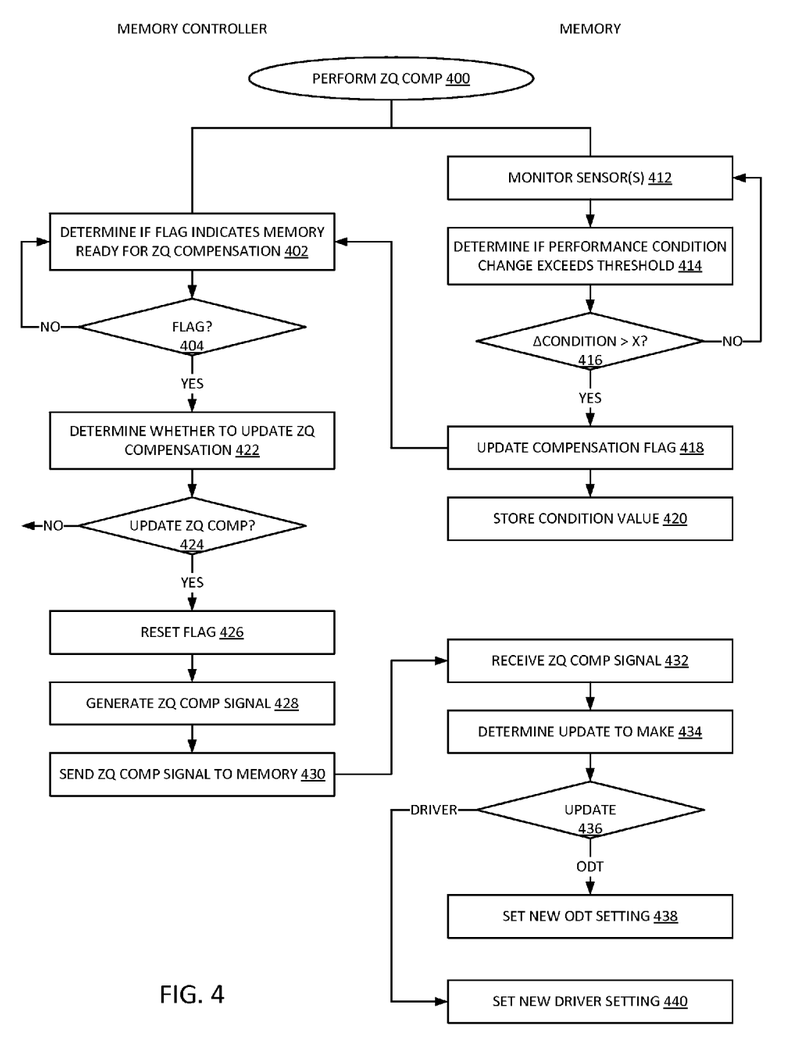
FIG. 4 is a flow diagram of an embodiment of a process for performing impedance compensation based on memory device sensor data.

FIG. 4 is a flow diagram of an embodiment of a process for performing impedance compensation based on memory device sensor data. System 400 for performing impedance compensation can be performed by a system in accordance with any embodiment described herein, such as system 100 of FIG. 1 and/or system 200 of FIG. 2. In one embodiment, the impedance compensation operations include parallel operations at the memory controller and the memory device. In one embodiment, the memory controller monitors a flag to be set by the memory, and determines if the flag indicates the memory is read for an impedance compensation adjustment, 402. If the flag does not indicate the need to change compensation, 404 NO branch, the memory controller continues to monitor the flag without issuing an impedance compensation command.

While the memory controller is monitoring the flag, the memory monitors one or more sensors to determine whether to set the flag, 412. The sensor(s) monitor one or more performance conditions that affect I/O impedance of the memory. Based on values read from the sensor(s), in one embodiment, the memory determines if a change in a performance condition exceeds a threshold, 414. In one embodiment, the memory controller reads the values and makes the determination. If the change in condition is not greater than some threshold X, 416 NO branch, the memory continues to monitor the sensor, 412. It will be understood that the change in performance condition could be positive or negative. Thus, X could represent either the positive or negative number, or the condition in 416 could be whether the absolute value of the change exceeds X.

If the change in condition does exceed the threshold, 416 YES branch, in one embodiment, the memory updates a compensation flag or other indication, 418. The flag indicates that the memory is ready to perform impedance compensation. In one embodiment, the memory stores the condition value for use to compare against subsequent readings from the sensor, 420. When the memory sets the flag, 418, the memory controller will detect the flag when it next evaluates the flag. If the flag is set, 404 YES branch, in one embodiment, the memory controller determines whether to issue an impedance compensation command, 422. In one embodiment, the memory controller will wait until multiple memory devices are ready for compensation prior to issuing a command. In one embodiment, the memory controller will delay issuing a command until after issuing a time-sensitive memory access command.

Thus, if the memory controller determines not to update the impedance compensation of the memory, 424 NO branch, there might be any of a number of operations the memory controller may perform prior to issuing the command. Eventually the memory controller will update the impedance compensation. If the memory controller is to update the impedance compensation, 424 YES branch, the memory controller can reset the flag, 426. In one embodiment, the memory controller can directly write the value of the flag. In one embodiment, the memory controller issues a signal that causes the memory to reset the flag.

The memory controller generates one or more impedance compensation signals or commands to issue to one or more memories, 428. The memory controller sends the signals or issues the commands to the memory, 430. The memory receives the ZQ comp signal and decodes the signal, 432. In one embodiment, the memory determines what update to make, 434. In one embodiment, the ZQ comp signal indicates what change to make. In one embodiment, the memory determines what change to make in association with detecting the condition indicated by the sensor and setting the flag. In one embodiment, the memory can update different aspects of the I/O impedance.

In one embodiment, the memory updates a setting related to ODT, 436 ODT branch. The memory can set a new setting for one or more aspects of ODT, such as read impedance and/or write impedance, 438. In one embodiment, the memory updates a setting related to the output driver, 436 DRIVER branch. The memory can set a new setting for the output driver, 440.

Figure 5:
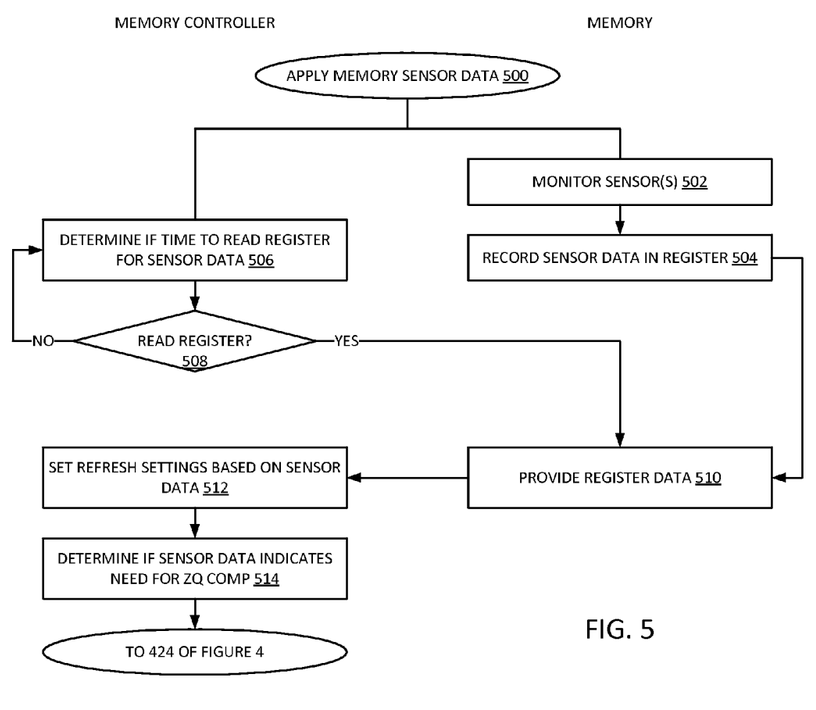
FIG. 5 is a flow diagram of an embodiment of a process for applying memory device sensor data for self-refresh control and impedance compensation.

FIG. 5 is a flow diagram of an embodiment of a process for applying memory device sensor data for self-refresh control and impedance compensation. Process 500 illustrates an embodiment of how a memory can apply sensor data. Whereas process 400 of FIG. 4 illustrates a process in which the memory device itself makes a determination to set a flag based on a reading of its sensor(s), process 500 illustrates a process in which the memory controller can compute the determination. The memory includes one or more sensors, which is monitors for a change, 502. In one embodiment, the memory periodically acquires and records the sensor reading. In one embodiment, the memory records the sensor data in a register accessible to the memory controller, 504.

In one embodiment, the memory controller determines if it is time to read the register for the sensor data, 506. If it is time for the memory controller to read the register, 508 YES branch, the memory provides the register data, 510. In one embodiment, the memory controller uses the register data with the sensor readings to determine what settings to apply to the memory for purposes of refresh and/or self-refresh. Thus, the memory controller can set one or more refresh settings based on the sensor data, 512. In one embodiment, the memory controller applies the sensor data also to determine whether to issue a ZQ compensation command to the memory. In one embodiment, such an operation may require the memory controller to manage the traditional 1 us timing of tZQCal, but will only need to manage such timing when a change in compensation is required. Thus, the memory controller can still preserve bandwidth on the C/A bus by such an approach to ZQ comp. Thus, the memory controller can determine if the sensor data indicates a need for impedance compensation in the memory, 514. In one embodiment, the determination and issuance of the impedance compensation can be performed in accordance with process 400 starting at 424. The difference would be that the memory controller may need to issue both a ZQCal initiate (or start) command as well as a latch as the ZQ comp signal or command.

Figure 6:
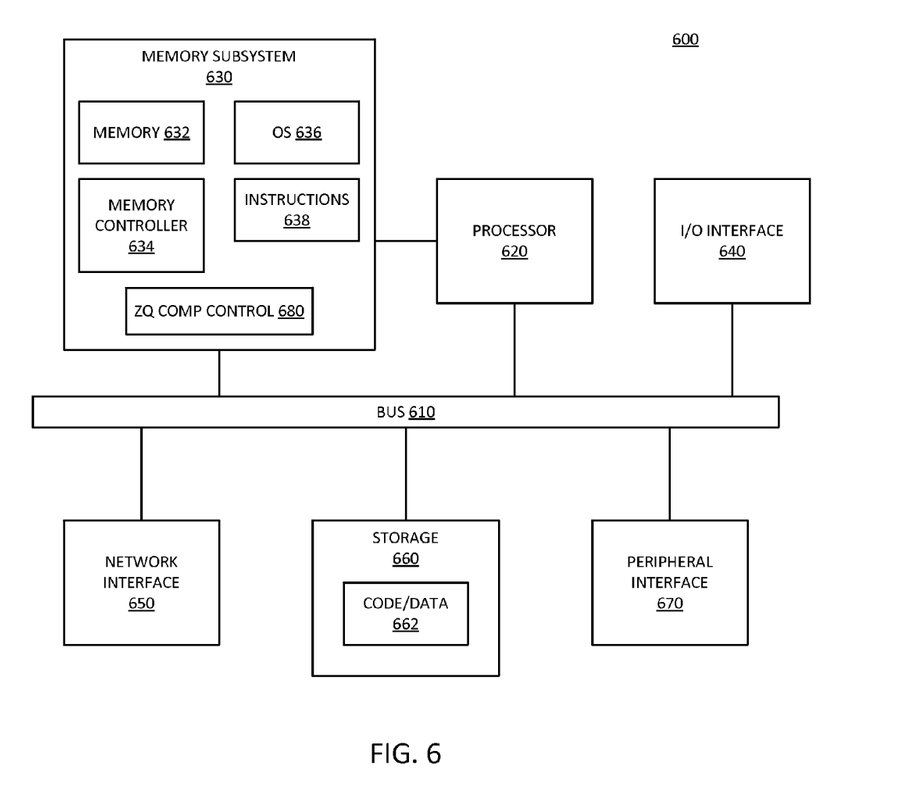
FIG. 6 is a block diagram of an embodiment of a computing system in which impedance compensation based on memory device sensor data can be implemented.

FIG. 6 is a block diagram of an embodiment of a computing system in which impedance compensation based on memory device sensor data can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface (s) 640, network interface 650, one or more internal mass storage device (s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts. In one embodiment, system 600 is a server device. In one embodiment in a server device, system 600 can be one of multiple systems combined together in a server configuration. For example, the server can be implemented as a blade server combined with other blade servers in a chassis system.

In one embodiment, memory subsystem 630 includes ZQ comp control 680, which represents logic within system 600 to implement I/O impedance control for memory 632 based on sensor data. ZQ comp control 680 is shown as a separate element in system 600, but represents logic in memory controller 634 and memory 632 to implement ZQ comp in accordance with any embodiment described herein. In one embodiment, memory 632 determines when it needs ZQ comp and sets a flag to trigger memory controller 634 to issue a ZQ comp command.

Figure 7:
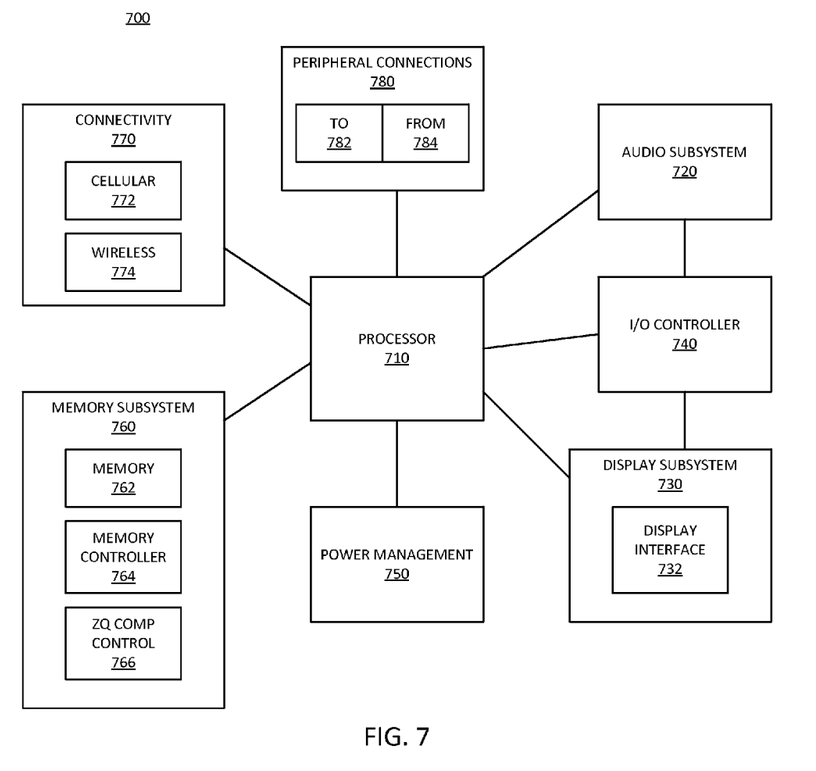
FIG. 7 is a block diagram of an embodiment of a mobile device in which impedance compensation based on memory device sensor data can be implemented.

FIG. 7 is a block diagram of an embodiment of a mobile device in which impedance compensation based on memory device sensor data can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device (s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 760 includes ECC 766. ECC 766 is shown as a separate element, but represents internal ECC in memory devices 762 and system level ECC in memory controller 764. The internal ECC generates internal check bits after performing error detection and correction in response to a read request. The external ECC of memory controller 764 can use the check bits as metadata to augment error correction at the system level.

In one embodiment, memory subsystem 760 includes ZQ comp control 766, which represents logic within system 700 to implement I/O impedance control for memory 762 based on sensor data. ZQ comp control 766 is shown as a separate element in system 700, but represents logic in memory controller 764 and memory 762 to implement ZQ comp in accordance with any embodiment described herein. In one embodiment, memory 762 determines when it needs ZQ comp and sets a flag to trigger memory controller 764 to issue a ZQ comp command.

In one aspect, a method for impedance compensation of an I/O (input/output) interface includes: detecting, via logic on a memory device, a change in a performance condition affecting I/O impedance for the memory device; triggering a compensation flag signal to an associated memory controller in response to detecting the change; and receiving at the memory device from the memory controller, in response to the compensation flag signal, an impedance compensation signal triggering a change in I/O impedance compensation in the memory device.

In one embodiment, detecting the change in performance condition comprises detecting a change in operating temperature that exceeds a threshold. In one embodiment, detecting the change in performance condition comprises detecting a change in operating voltage that exceeds a threshold. In one embodiment, detecting the change in performance condition comprises detecting the change with on-die sensors. In one embodiment, triggering the compensation flag signal comprises setting a value in a Mode Register of the memory device to be checked periodically by the memory controller. In one embodiment, the impedance compensation signal triggering the change in I/O impedance compensation comprises triggering an adjustment to a driver impedance. In one embodiment, the impedance compensation signal triggering the change in I/O impedance compensation comprises triggering an adjustment to an on-die termination value. In one embodiment, the memory device is one of multiple memory devices coupled in parallel to the memory controller, and wherein receiving the impedance compensation signal in response to the compensation flag signal comprises receiving the impedance compensation signal from the memory controller only after the memory controller has received a compensation flag from a threshold number of the multiple memory devices. In one embodiment, the memory device is one of multiple memory devices coupled in parallel to the memory controller, and wherein receiving the impedance compensation signal triggering the change in I/O impedance compensation further comprises receiving one of a continuous sequence of impedance compensation signals sent in sequence by the memory controller. In one embodiment, the impedance compensation signal comprises a ZQCal latch signal that triggers the memory device to set an impedance compensation configuration. In one embodiment, the impedance compensation signal comprises a ZQCal start signal that triggers the memory device to initiate an impedance compensation calibration routine, and a ZQCal latch signal that triggers the memory device to set an impedance compensation configuration.

In one aspect, a memory controller that manages impedance compensation of a memory includes: I/O (input/output) hardware coupled to a memory device to read data from the memory device indicating a change in a sensor reading; and a scheduler to determine that a performance condition affecting I/O impedance for the memory device has changed in excess of a threshold based on reading the data from the memory device, and in response to determining that the performance condition has changed in excess of the threshold, to generate an impedance compensation signal to the memory device to trigger a change in I/O impedance compensation in the memory device.

In one embodiment, the I/O hardware is to a flag set by the memory device indicating that the performance condition has changed in excess of the threshold. In one embodiment, the I/O hardware is to read data from the sensor in response to a flag set by the memory device. In one embodiment, the I/O hardware is to read data from the sensor in response to a flag set by the memory device indicating that the performance condition has changed in excess of the threshold. In one embodiment, the scheduler is to determine that a change in operating temperature exceeds a threshold within the memory. In one embodiment, the scheduler is to determine that a change in operating voltage that exceeds a threshold within the memory. In one embodiment, the sensor comprises an on-die sensor of the memory device that monitors performance conditions to set a parameter for refresh for the memory device. In one embodiment, the I/O hardware is to read one or more values from a Mode Register of the memory device. In one embodiment, the I/O hardware is to periodically check the one or more values of the Mode Register. In one embodiment, the scheduler is to generate an impedance compensation signal triggering an adjustment to a driver impedance of the memory device I/O. In one embodiment, the scheduler is to generate an impedance compensation signal triggering an adjustment to an on-die termination value of the memory device I/O. In one embodiment, the I/O couples to multiple parallel memory devices, and wherein the scheduler is to delay generating the impedance compensation signal for a memory device until at least a threshold number of memory devices are determined to have a performance conditions affecting I/O impedance that have changed in excess of a threshold. In one embodiment, the I/O couples to multiple parallel memory devices, and wherein the scheduler is to schedule a continuous sequence of impedance compensation signals sent in sequence to at least a plurality of the multiple parallel memory devices. In one embodiment, the I/O couples to multiple parallel memory devices, and wherein the scheduler is to schedule a period of time to cease sending access commands on a command/address (C/A) bus for all memory devices, and to send a sequence of impedance compensation signals to at least two of the memory devices while no access command traffic is sent over the C/A bus. In one embodiment, the scheduler is to generate a ZQCal latch signal that triggers the memory device to set an impedance compensation configuration. In one embodiment, the scheduler is to generate a ZQCal start signal that triggers the memory device to initiate an impedance compensation calibration routine, and a ZQCal latch signal that triggers the memory device to set an impedance compensation configuration.

In one aspect, an electronic device with a memory subsystem includes: an LPDDR (low power dual data rate) DRAM (dynamic random access memory) including an on-die sensor to detect changes to a performance condition that affects I/O impedance for the DRAM, and a register to record data about the performance condition; and a memory controller to control access to the LPDDR DRAM, the memory controller including I/O (input/output) hardware coupled to the DRAM to read data from the DRAM indicating a change in a sensor reading; and a scheduler to determine that a performance condition affecting I/O impedance for the DRAM has changed in excess of a threshold based on reading the data from the memory device, and in response to determining that the performance condition has changed in excess of the threshold, to generate an impedance compensation signal to the DRAM to trigger a change in I/O impedance compensation in the DRAM; and a touchscreen display coupled to generate a display based on data accessed from the DRAM. The electronic device can include a memory controller coupled to a DRAM in accordance with any embodiment described above with respect to a memory controller coupled to a memory device.

In one aspect, an apparatus for impedance compensation of an I/O (input/output) interface includes: means for detecting, via logic on a memory device, a change in a performance condition affecting I/O impedance for the memory device; means for triggering a compensation flag signal to an associated memory controller in response to detecting the change; and means for receiving at the memory device from the memory controller, in response to the compensation flag signal, an impedance compensation signal triggering a change in I/O impedance compensation in the memory device. The apparatus can include means for performing any embodiment of the method described above.

In one aspect, an article of manufacture comprising a computer readable storage medium having content stored thereon, which when accessed causes a machine to perform operations including: detecting, via logic on a memory device, a change in a performance condition affecting I/O impedance for the memory device; triggering a compensation flag signal to an associated memory controller in response to detecting the change; and receiving at the memory device from the memory controller, in response to the compensation flag signal, an impedance compensation signal triggering a change in I/O impedance compensation in the memory device. The article of manufacture can include content for performing operation in accordance with any embodiment of the method described above.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for impedance compensation of an I/O (input/output) interface, comprising:
   detecting, via logic on a memory device, a change in a performance condition of the memory device affecting I/O impedance for the memory device;
   triggering a compensation flag signal from the memory device to an associated memory controller in response to detecting the change; and
   receiving at the memory device from the memory controller, in response to the compensation flag signal, an impedance compensation signal generated by the memory controller, triggering a change in I/O impedance compensation in the memory device;
   wherein the triggering the compensation flag signal and the receiving the impedance compensation signal in response to the compensation flag signal are performed at least partially in place of a regular schedule of impedance compensation signals to be generated by the memory controller.

2. The method of claim 1, wherein detecting the change in performance condition comprises detecting a change in operating temperature that exceeds a threshold.

3. The method of claim 1, wherein detecting the change in performance condition comprises detecting a change in operating voltage that exceeds a threshold.

4. The method of claim 1, wherein detecting the change in performance condition comprises detecting the change with on-die sensors.

5. The method of claim 1, wherein triggering the compensation flag signal comprises setting a value in a Mode Register of the memory device to be checked periodically by the memory controller.

6. The method of claim 1, wherein the impedance compensation signal triggering the change in I/O impedance compensation comprises triggering an adjustment to a driver impedance.

7. The method of claim 1, wherein the impedance compensation signal triggering the change in I/O impedance compensation comprises triggering an adjustment to an on-die termination value.

8. The method of claim 1, wherein the memory device is one of multiple memory devices coupled in parallel to the memory controller, and wherein receiving the impedance compensation signal in response to the compensation flag signal comprises receiving the impedance compensation signal from the memory controller only after the memory controller has received a compensation flag from a threshold number of the multiple memory devices.

9. The method of claim 1, wherein the memory device is one of multiple memory devices coupled in parallel to the memory controller, and wherein receiving the impedance compensation signal triggering the change in I/O impedance compensation further comprises receiving one of a continuous sequence of impedance compensation signals sent in sequence by the memory controller.

10. The method of claim 1, wherein the impedance compensation signal comprises a ZQCal latch signal that triggers the memory device to set an impedance compensation configuration.

11. The method of claim 1, wherein the impedance compensation signal comprises a ZQCal start signal that triggers the memory device to initiate an impedance compensation calibration routine, and a ZQCal latch signal that triggers the memory device to set an impedance compensation configuration.

12. A memory controller that manages impedance compensation of a memory, comprising:
   I/O (input/output) hardware coupled to a memory device to read data from the memory device to indicate an update in a sensor reading of a sensor of the memory device; and
   a scheduler to determine in response to the update in the sensor reading that a change in a performance condition at the memory device related to I/O impedance for the memory device is in excess of a threshold based on access of the data from the memory device, and in response to the change in excess of the threshold, to generate an impedance compensation signal to the memory device to trigger a change in I/O impedance compensation in the memory device;
   wherein generation of the impedance compensation signal in response to indication of the update in the sensor reading is to be performed at least partially in place of a regular schedule of impedance compensation signals to be generated by the scheduler.

13. The memory controller of claim 12, wherein the I/O hardware is to read the data in response to a flag set by the memory device to indicate that the change in the performance condition in excess of the threshold.

14. The memory controller of claim 12, wherein the scheduler is to determine that a change in operating temperature exceeds a threshold within the memory, or to determine that a change in operating voltage that exceeds a threshold within the memory.

15. The memory controller of claim 12, wherein the I/O hardware is to read one or more values from a Mode Register of the memory device.

16. The memory controller of claim 12, wherein the scheduler is to generate an impedance compensation signal to trigger an adjustment to a driver impedance of the memory device I/O, or trigger an adjustment to an on-die termination value of the memory device I/O.

17. The memory controller of claim 12, wherein the I/O hardware couples to multiple parallel memory devices, and wherein the scheduler is to delay generation of the impedance compensation signal for a memory device until at least a specific number of memory devices are determined to have changes in performance conditions related to I/O impedance in excess of a threshold.

18. The memory controller of claim 12, wherein the I/O hardware couples to multiple parallel memory devices, and wherein the scheduler is to schedule a period of time to cease sending access commands on a command/address (C/A) bus for all memory devices, and to send a sequence of impedance compensation signals to at least two of the memory devices while no access command traffic is sent over the C/A bus.

19. An electronic device with a memory subsystem, comprising:
   an LPDDR (low power dual data rate) DRAM (dynamic random access memory) device including an on-die sensor to detect changes to a performance condition that affects I/O impedance for the DRAM device, and a register to record data about the performance condition; and
   a memory controller to control access to the LPDDR DRAM device, the memory controller including
      I/O (input/output) hardware coupled to the DRAM device to read data from the DRAM device to indicate an update in a sensor reading of a sensor of the DRAM device; and
      a scheduler to determine in response to the update in the sensor reading that a change in a performance condition at the DRAM device related to I/O impedance for the DRAM device is in excess of a threshold based on access of the data from the DRAM device, and in response to the change in excess of the threshold, to generate an impedance compensation signal to the DRAM device to trigger a change in I/O impedance compensation in the DRAM device;
      wherein generation of the impedance compensation signal in response to indication of the update in the sensor reading is to be performed at least partially in place of a regular schedule of impedance compensation signals to be generated by the scheduler; and
   a touchscreen display coupled to generate a display based on data accessed from the DRAM device.

20. The electronic device of claim 19, wherein the scheduler is to determine that a change in operating temperature exceeds a threshold within the DRAM device, or to determine that a change in operating voltage that exceeds a threshold within the DRAM device.

21. The electronic device of claim 19, wherein the scheduler is to generate an impedance compensation signal to trigger an adjustment to a driver impedance of the DRAM device I/O, or to trigger an adjustment to an on-die termination value of the DRAM device I/O.

22. The electronic device of claim 19, wherein the LPDDR DRAM device is one of multiple parallel LPDDR DRAM devices, and wherein the scheduler is to delay generation of the impedance compensation signal for a DRAM device until at least a specific number of DRAM devices are determined to have changes in performance conditions related to I/O impedance in excess of a threshold.

* * * * *